United States Patent [19]

Roy

[11] Patent Number: 4,589,194
[45] Date of Patent: May 20, 1986

[54] ULTRASONIC SCRIBING OF THIN FILM SOLAR CELLS

[75] Inventor: Jeffery J. Roy, Newbury Park, Calif.

[73] Assignee: Atlantic Richfield Company, Los Angeles, Calif.

[21] Appl. No.: 566,741

[22] Filed: Dec. 29, 1983

[51] Int. Cl.$^4$ .............................................. H01L 31/18
[52] U.S. Cl. ......................................... 29/583; 29/572; 83/875; 83/880; 136/244; 136/258
[58] Field of Search ................... 29/572, 583; 136/244, 136/249 MS, 258 AM; 83/880, 875

[56] References Cited

U.S. PATENT DOCUMENTS

| | | | |
|---|---|---|---|
| 4,243,432 | 1/1981 | Jordan et al. | 136/244 |
| 4,315,096 | 2/1982 | Tyan et al. | 136/244 |
| 4,388,482 | 6/1983 | Hamakawa et al. | 136/258 |

Primary Examiner—Aaron Weisstuch
Attorney, Agent, or Firm—Albert C. Metrailer

[57] ABSTRACT

A process for separating a back contact metallization on a thin film solar cell array into individual cell back electrodes by using a small diameter ultrasonically driven scribe tip with sufficient tip force to remove substantially all of the underlying semiconductor layer.

6 Claims, 3 Drawing Figures

ULTRASONIC SCRIBING OF THIN FILM SOLAR CELLS

BACKGROUND OF THE INVENTION

This invention relates to integrated arrays of thin film photovoltaic cells and more particularly to a method for scribing back electrical contacts on such arrays to form back electrodes for the separate cells.

Much work has been done in recent years to develop practical thin film photovoltaic cells. It is generally believed that ultimately the cost of producing such cells will be considerably less than the cost of commericially available solar cells fabricated from single crystal or polycrystalline silicon slices. Cost reduction is based on the reduction in the amount of semiconductor material required for thin film cells. In addition, it is expected that thin film processes will be more easily automated, so that labor costs can also be reduced.

U.S. Pat. No. 4,315,096 issued to Tyan, et al, on Feb. 9, 1982 describes a somewhat typical thin film photovoltaic cell array. This patent is hereby incorporated by reference. The Tyan, et al, patent in particular discusses the desirability of depositing the various layers of a thin film solar array in continuous layers which are then formed into a plurality of separate but series connected cells. Tyan teaches that the cells may be formed either by mechanically scribing the various layers at the appropriate stages of manufacture or by use of laser scribing techniques.

The various layers of materials in such thin film solar cell structures have considerably different mechanical characteristics. Thus the semiconductor layer, typically silicon, is quite hard and brittle. In contrast, the back contact layer is typically aluminum which is quite soft and malleable. These characteristics cause several problems in mechanical scribing of the back contact on a production basis. Based on the softness of the back contact it would appear to be relatively simple to remove the bulk of the material by drawing a scribe point across the desired scribe line. However, in practice, the aluminum usually smears or flows and this action makes it difficult to remove the bulk of the metal. When sufficient force is applied to remove most of the metal from the scribe line the smearing usually leaves a thin layer shorting the adjacent back contact segments together. As noted in the Tyan patent, it is generally desirable to remove at least a portion, if not all, of the semiconductor layer along the scribe path. When a sufficiently hard scribe point is applied with sufficient pressure to cut through both the back contact material and the semiconductor layer, shorting can still occur. This is typically caused by smearing of the back contact metal along the scribed edges of the semiconductor layer causing a direct short circuit between the front and back faces of the active device. In addition when pressures of this level are applied damage often occurs to the transparent conductive oxide layer under the semiconductor layer or even to the glass substrate.

Thus it is seen that it is desirable in the manufacture of thin film photovoltaic cell arrays to provide an improved method for separating a back contact layer into separate back electrodes for the individual cells which are truly electrically isolated from both adjacent back electrodes and from front electrodes.

SUMMARY OF THE INVENTION

In accordance with the present invention, a back contact sheet on a thin film photovoltaic cell array is separated into individual cell back electrodes by use of a mechanical scribe stylus drawn along the desired scribe path while being ultrasonically vibrated to cause chipping away of at least a portion of the semiconductor material and removal of the back contact material along the scribe line with essentially no short circuiting between adjacent back electrodes or between back and front electrodes.

BRIEF DESCRIPTION OF THE DRAWINGS

The present invention may be better understood by reading the following detailed description of the preferred embodiment with reference to the accompanying drawings wherein.

DESCRIPTION OF THE PREFERRED EMBODIMENT

Figure 1:
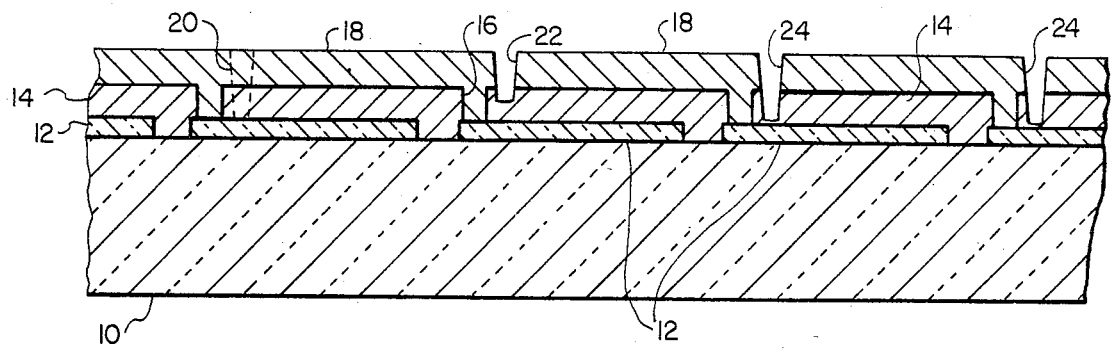
FIG. 1 is a cross-sectional illustration of a thin film photovoltaic cell array according to the present invention.

With reference now to FIG. 1 there is illustrated, in cross-section, a thin film photovoltaic cell structure according to the present invention. While the illustrated structure is very similar to that taught in the above referenced Tyan, et al, patent, the materials of the preferred embodiment are preferably similar to those taught in U.S. Pat. No. 4,388,482 issued to Hamakawa, et al, on June 14, 1983. The basic supporting structure of the cell array is a glass substrate 10, typically two millimeters thick. A transparent conductive oxide, TCO, layer 12 has been deposited and patterned on the upper surface of substrate 10 to form front electrodes. TCO layer 12 is typically two thousand angstroms thick. A semiconductor layer 14 containing an active junction is deposited over TCO layer 12 and again appropriately patterned. Thus, at 16, a portion of the semiconductor layer 14 has been removed to allow a back electrode to contact one edge of TCO layer 12. In the preferred embodiment, layer 14 is an amorphous silicone p-i-n structure similar to that taught by Hamakawa and having a total thickness of about four thousand angstroms. A final back contact conductor layer 18 is deposited as a continuous sheet over layers 12 and 14. As illustrated, layer 18 fills the grooves 16 formed in the semiconductor layer 14 and thereby contacts the TCO layer 12. In the preferred embodiment, layer 18 is formed by sputtering or evaporating aluminum to a thickness from about one thousand to about five thousand angstroms. After layer 18 is deposited it must be patterned to form separate back electrodes for each of the separate cells forming the solar array.

On the left side of FIG. 1, layer 18 is shown prior to the isolation step and the location of a desired groove is illustrated by the dotted lines 20. The groove must remove all of the back contact metal 18 and desirably removes all of the underlying semiconductor material. However, to avoid damage to the TCO layer 12, the groove should be no deeper than illustrated at 20 and also at 24. Depending upon the conductivity of various portions of semiconductor layer 14, it is allowable in some cases, as taught by Tyan, et al, to remove only a portion of the semiconductor material 14. Thus, as illustrated by groove 22, it is often allowable to leave a portion of the semiconductor 14 in place. In the preferred form, as illustrated by grooves 24, all of the semiconductor layer 14 underlying the desired scribed lines in back electrode layer 18 is removed.

Figure 2:
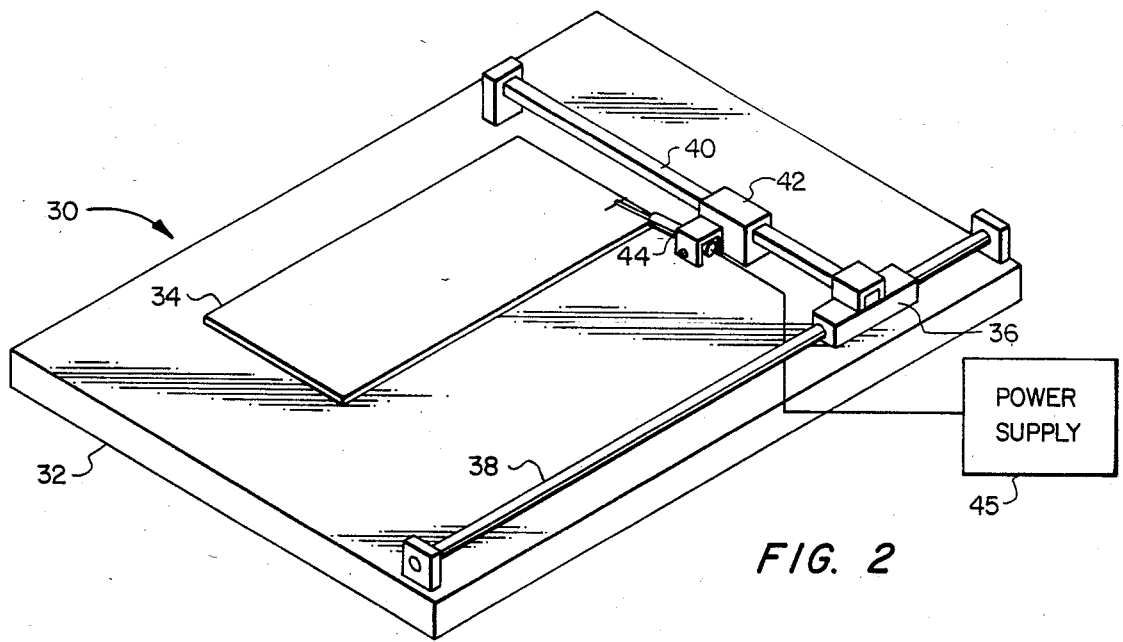
FIG. 2 is a perspective view of a scribing table carrying an ultrasonic scribing tool according to the present invention.

With reference now to FIG. 2 there is illustrated a manual scribing table 30 modified for performing the process of the present invention. Table 30 includes a base plate 32 adapted for holding a glass plate 34 on which a photovoltaic cell array is being produced. A slide 36 is supported on a bar 38 mounted on one edge of base plate 32. A bar 40 extends from slide 36 at right angles to the slide bar 38. A scribe holding block 42 is slidably carried on bar 40 and carries an ultrasonic scribing head 44, the details of which are described with reference to FIG. 3 below. A power supply 45 is connected to the ultrasonic scribing head 44 to provide the required driving signal.

Figure 3:
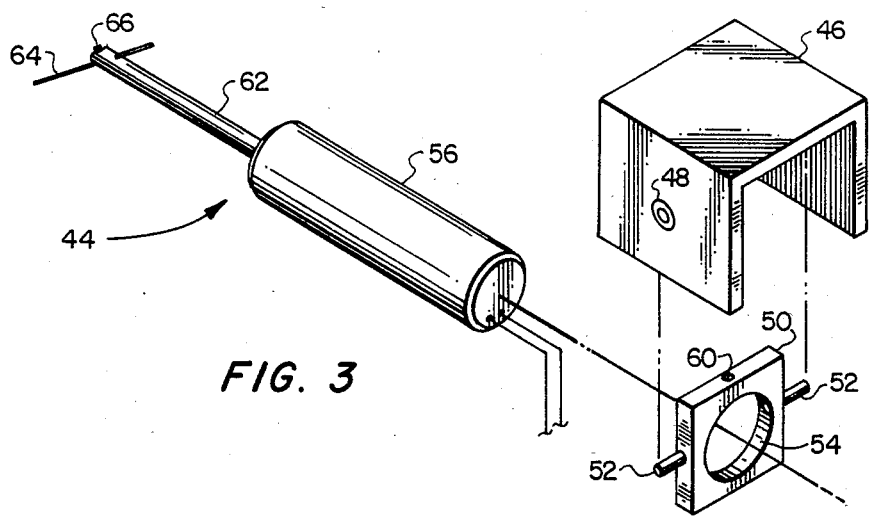
FIG. 3 is an exploded view of the ultrasonic scribing tool and its support and pivot assembly.

With reference now to FIG. 3, the pivoting support structure for ultrasonic head 44 is illustrated in more detail. A U-shaped bracket 46, normally attached to block 42, has two pivot points 48 including miniature ballbearings. A collar 50 is sized to fit within bracket 46 and has pivot arms 52 for engaging the pivot points 48. A circular aperture 54 in collar 50 is sized to receive the transducer portion 56 of the ultrasonic scribing head. A set screw 60 in one edge of collar 50 is provided for fixing the position of transducer 56 within aperture 54. Ultrasonic head 44 includes beam 62 through which ultrasonic vibrations are coupled to a scribe stylus 64. A set screw 66 allows adjustment and replacement of stylus 64.

In the preferred embodiment the ultrasonic scribing head 44 and power supply 45 were parts of an ultrasonic cutter sold under the part number AUC-101 by Alessi Industries Inc. of Costa Mesa, Calif. The power supply 45 provides an electrical driving signal at 60 KHz at power levels adjustable between 0 and 1 watt.

In using the ultrasonic scribe it is first necessary to establish an appropriate force to be applied to the scribe tip or stylus 64. This force is adjustable up to about twenty grams simply by adjusting the position of scribing head 44 within collar 50 so that a desired portion of its weight is supported on tip 64. To achieve tip force greater than twenty grams, a spring has been added between bracket 46 and transducer head 56. When a desired tip pressure has been set, power supply 45 is activated and adjusted to provide a preselected level of driving power to the ceramic magnetostrictive transducer within scribing head 44. Scribing table 30 is then operated in a basically conventional manner. A substrate 34, with appropriate films deposited thereon, is positioned on base plate 32 as shown in FIG. 2. Slide 36 is moved along bar 38 until stylus 64 is positioned over substrate 34 at a desired scribe line location on one edge of the substrate. The stylus is then lowered to contact substrate 34 and block 42 is manually drawn along bar 40 to cut a straight scribe line across substrate 34. In commercial production it is expected that scribe table 30 will be replaced with an automatic X-Y positioning system which will automatically cut the large number of scribe lines needed, preferably under computer control.

Various combinations of scribe tip type, tip force, and ultrasonic energy level were used in experiments to generate grooves 22 or 24 in the structure illustrated in FIG. 1 having an aluminum back contact 18 with a thickness of about 5,000 angstroms. A tungsten carbide scribe tip supplied with the equipment having a rounded end with a 0.002 inch radius was used at tip forces ranging up to 200 grams and over the entire range of power levels up to 1 watt. While some reasonable scribing was achieved at the high force and power levels the results were not repeatable and therefore not useful for production work.

Much better results were achieved by using a tungsten carbide stylus having a radius of 0.00025 inch which had been broken off to provide an essentially round flat tip, or truncated cylinder, rather than the normal smooth hemispherical end. Good repeatable scribe lines were cut at a tip force of about 100 grams and an ultrasonic power level of about 0.55 watt. The scribe lines generated were about 0.002 inches wide and provided sharp cutting of the aluminum metal and removal of the underlining semiconductor material, without significant damage to the TCO layer.

The best results were achieved using a diamond tipped stylus having a tip radius of 2.5 micron. Using a tip force of 5 to 7 grams and a power level of 0.45 watt, clean scribed lines were cut at a width of about 15 microns through the back aluminum metal and the underlying silicon film, without significant damage to the TCO layer. These results were found to be quite repeatable and thus appear suitable for production use. On microscopic examination of the diamond tip used in this experiment it was discovered that it was partly broken and therefore included sharp edges which apparently aided in generation of clean scribed lines. Visual examination of the scribed lines indicate that there is no smearing of the soft aluminum metal and no shunting across the scribed groove was detectable. It is believed that the clean removal of the aluminum layer is a result of rapid removable of the brittle silicon layer in the form of small chips caused by the ultrasonic vibration of the scribe tip.

In summary, it is possible to achieve highly repeatable, reliable and very narrow scribe grooves in the back contact metal with very low tip force and ultrasonic power level if very small diameter scribe tips are used.

While the present invention has been illustrated and described with reference to specific apparatus and methods of use it is apparent that various modifications and changes can be made within the scope of the present invention as defined by the appended claims.

What is claimed is:

1. A process for separating a back contact of a thin film photovoltaic cell array into a plurality of separate back electrodes, one for each cell, where said back contact has been deposited as a continuous sheet over a semiconductor layer having an active region therein, comprising:
    scribing preselected regions of said back contact sheet with an ultrasonically driven stylus at an average applied force and power level selected to penetrate all of said back contact sheet and at least a portion of said semiconductor layer.

2. The process of claim 1 wherein said back contact is a thin film of aluminum and said semiconductor layer is primarily silicon.

3. A process according to claim 1 wherein said stylus has a tip radius of less than 0.00025 inch.

4. In a process for scribing a thin film metallic conductor deposited over a thin film of semiconductor material,
the use of an ultrasonically driven stylus at an average applied force and power level selected to penetrate all of said metallic conductor and at least a portion of said semiconductor layer.

5. The process of claim 4 wherein said metallic conductor is aluminum having a thickness of from 1000 to about 5000 angstroms and said semiconductor material is primarily silicon.

6. A process according to claim 4 wherein said stylus has a tip radius of less than 0.00025 inch.

* * * * *